(12) United States Patent
Sudo

(10) Patent No.: US 11,307,636 B2
(45) Date of Patent: Apr. 19, 2022

(54) SEMICONDUCTOR STORING APPARATUS AND FLASH MEMORY OPERATION METHOD

(71) Applicant: Winbond Electronics Corp., Taichung (TW)

(72) Inventor: Naoaki Sudo, Kanagawa (JP)

(73) Assignee: WINBOND ELECTRONICS CORP., Taichung (TW)

( * ) Notice: Subject to any disclaimer, the term of this patent is extended or adjusted under 35 U.S.C. 154(b) by 1 day.

(21) Appl. No.: 16/882,772

(22) Filed: May 26, 2020

(65) Prior Publication Data

US 2021/0373645 A1 Dec. 2, 2021

(51) Int. Cl.
*G06F 1/32* (2019.01)
*G06F 1/3234* (2019.01)

(52) U.S. Cl.
CPC .... *G06F 1/3275* (2013.01); *G11C 2207/2227* (2013.01)

(58) Field of Classification Search
CPC .............. G06F 1/3275; G11C 2207/2227
See application file for complete search history.

(56) References Cited

U.S. PATENT DOCUMENTS

| | | | |
|---|---|---|---|
| 7,397,721 B2 | 7/2008 | Lee | |
| 2004/0078611 A1* | 4/2004 | Hoehler | G06F 1/3225 713/323 |
| 2004/0174762 A1* | 9/2004 | Suh | G11C 7/1045 365/226 |
| 2011/0185208 A1 | 7/2011 | Iwamoto et al. | |
| 2019/0080728 A1* | 3/2019 | Lee | G11C 5/148 |

FOREIGN PATENT DOCUMENTS

| | | |
|---|---|---|
| CN | 103809994 | 5/2014 |
| JP | 2006252748 | 9/2006 |
| TW | 201346519 | 11/2013 |
| TW | 201405298 | 2/2014 |
| TW | I437434 | 5/2014 |

OTHER PUBLICATIONS

"Office Action of Taiwan Counterpart Application", dated Jul. 29, 2020, p. 1-p. 6.

* cited by examiner

*Primary Examiner* — Stefan Stoynov
(74) *Attorney, Agent, or Firm* — JCIPRNET

(57) ABSTRACT

A flash memory capable of automatically releasing a deep power-down mode is provided. The flash memory includes: a standard command interface (I/F) circuit and a deep power-down mode (DPD) controller, operating through an external power voltage; and an internal circuit, operating through internal voltages supplied from voltage supply nodes. The DPD controller detects whether the flash memory is in the deep power-down mode when a standard command is inputted to the standard command I/F circuit and recovers the internal circuit from the DPD mode in the case where the deep power-down mode is detected. The standard command is executed after the internal circuit is recovered.

10 Claims, 5 Drawing Sheets

| standard command | voltage supply node | recovery time |
|---|---|---|
| status read | INTVDD1 | fast |
| ID read | INTVDD1 | fast |
| PGM | INTVDD1/INTVDD2 | standard |
| RD | INTVDD1/INTVDD2 | standard |
| ERS | INTVDD1/INTVDD2 | standard |

FIG.5

SEMICONDUCTOR STORING APPARATUS AND FLASH MEMORY OPERATION METHOD

BACKGROUND

Technical Field

The disclosure relates to a semiconductor storing apparatus such as a flash memory, etc., and particularly relates to the operation of a stand-by mode or a deep power-down (DPD) mode.

Description of Related Art

A Not AND (NAND) flash memory can read or program in units of pages, and erase in units of blocks. The flash memory shown in Patent Document 1 (Japanese Patent Laid-Open No. 2006-252748) discloses the following technology. In a stand-by mode and a normal operation mode, different power voltages are supplied to a page buffer/readout circuit, thereby reducing power consumption in the stand-by mode.

SUMMARY

The disclosure provides a flash memory having an active mode and a stand-by mode. The active mode reads, programs, erases, etc. in response to a command from the user. The stand-by mode may handle the command from the user. In the stand-by mode, the operation of an internal circuit is restricted so that power consumption is below a certain level. However, in the case where the user inputs a command, the command must be immediately responded to. Therefore, even in the stand-by mode, off-leak current is generated in a volatile circuit such as a logic circuit, a register, etc. Off-leak current increases with the reduction in size of the element. In addition, in the case where an internal power voltage is used, an internal power voltage detection circuit must be operated, which consumes a certain amount of power. That is, it is difficult to reduce current consumption in the stand-by mode.

In order to further reduce power consumption in the stand-by mode, a deep power-down mode (hereinafter referred to as a DPD mode) is sometimes installed depending on the flash memory. In the DPD mode, the internal power supply to a part of the internal circuit used in the stand-by mode is turned off to reduce off-leakage current. For example, the flash memory enters the DPD mode through a DPD start command and restores from the DPD mode through a DPD release command.

Regarding the restoration from the DPD mode, a certain time is required for the shutdown circuit to operate normally, but on the other hand, power consumption can be significantly reduced.

FIG. 1A shows an example of an operation waveform when a NAND flash memory installed with a serial peripheral interface (SPI) function transitions to the DPD mode. In the stand-by mode, the flash memory is selected through setting a chip selection signal/CS to a low level. During the period, a DPD command (B9h) is inputted from a data registration terminal DI in synchronization with a clock signal. The flash memory transitions to the DPD mode at a time $T_{DPD}$ after a certain period tDP since the input of the DPD command, and blocks an internal voltage supply to a specific internal circuit. During a period before the time $T_{DPD}$, current in the stand-by mode is consumed. During a period after the time $T_{DPD}$, current in the DPD mode is consumed.

In addition, FIG. 1B shows an example of an operation waveform when restoring from the DPD mode. In the stand-by mode, the flash memory is selected through setting the chip selection signal/CS to a low level. During the period, a DPD release command (ABh) for releasing the DPD mode is inputted from the data registration terminal DI in synchronization with a clock signal. The flash memory starts supplying power to the shutdown internal circuit during a period tRES since the input of the DPD release command, and restores to the state where the internal circuit is in a normal operation at a time $T_{ST}$. Before the time $T_{ST}$, current in the DPD mode is consumed. After the time $T_{ST}$, current in the stand-by mode is consumed.

FIG. 2 is an internal block diagram of a NAND flash memory supporting the DPD mode. A flash memory 10 includes a DPD controller 20, a memory cell array 30, a row decoder 40, a page buffer/readout circuit 50, a peripheral circuit 60, a high voltage circuit 70, etc. An external power voltage VCC (for example, 3.3V) is supplied to the flash memory 10. The DPD controller 20 directly operates using the external power voltage VCC. A positive channel metal oxide semiconductor (PMOS) transistor P is connected between the external power voltage VCC and the internal circuit. A DPD enable signal DPDEN is applied to the gate of the transistor P. In the active mode and the stand-by mode, the DPD controller 20 generates the L-level DPD enable signal DPDEN to turn on the transistor P. As a result, an internal voltage VDD is supplied to each internal circuit via a voltage supply node INTVDD. In the DPD mode, the DPD controller 20 generates the H-level DPD enable signal DPDEN and sets the transistor P as not turned on. As a result, the supply of the external power voltage VCC is shut down and the operation of the internal circuit is stopped.

In the case where the DPD mode is released, as shown in FIG. 1B, the user inputs the DPD release command (ABh) from the outside. The DPD controller 20 responds to the input of the DPD release command, transitions the DPD enable signal DPDEN to L-level, turns on the transistor P, and starts supplying power from the external power voltage VCC to the internal circuit. As a result, the internal circuit is restored to an operable state after the period tRES.

In this way, for a conventional flash memory, in order to use the DPD mode, the user must not only input a DPD command, but also input a DPD release command. For flash memory controllers that do not support the DPD command and the DPD release command, there are issues such as being unable to use the DPD mode, etc.

The objective of the disclosure is to provide a semiconductor storing apparatus that can release the DPD mode without using a dedicated command for releasing the DPD mode.

The flash memory operation method of the disclosure includes the following steps. When a standard command including reading, programming, or erasing is inputted, whether a flash memory is in a DPD mode blocking power supply to a specific circuit is detected. In the case where the DPD mode is detected, the DPD mode is released. After the specific circuit is restored, the standard command is executed.

In an embodiment of the flash memory according to the disclosure, in the case where the DPD mode is not detected, the inputted standard command is executed without releasing the DPD mode. In an embodiment of the flash memory according to the disclosure, the step of releasing restores the specific circuit selected according to the type of the standard command. In an embodiment of the flash memory according to the disclosure, the step of releasing includes the following step. A switching transistor connected between a power voltage and the specific circuit is turned on. In an embodiment of the flash memory according to the disclosure, the DPD mode transitions from the stand-by mode and further reduces power consumption in the stand-by mode.

The semiconductor storing apparatus of the disclosure includes: a peripheral circuit; a detection component, for detecting whether a flash memory is in a DPD mode blocking power supply to one or more specific circuits of the peripheral circuit when a standard command including reading, programming, or erasing is inputted from the outside; a release component, for releasing the DPD mode in the case where the DPD mode is detected; and an execution component, for executing the standard command after the specific circuit is restored.

In an embodiment of the semiconductor storing apparatus according to the disclosure, in the case where the DPD mode is not detected, the standard command is executed without releasing the DPD mode through the release component. In an embodiment of the semiconductor storing apparatus according to the disclosure, the release component restores the specific circuit selected according to the type of the standard command. In an embodiment of the semiconductor storing apparatus according to the disclosure, the release component includes a plurality of switching transistors respectively connected between an external power voltage and a plurality of specific circuits. The release component turns on any one of the plurality of switching transistors. In an embodiment of the semiconductor storing apparatus according to the disclosure, the semiconductor storing apparatus is a flash memory.

According to the disclosure, the DPD mode can be released in response to the inputted standard command without a dedicated command for releasing the DPD mode, and the inputted standard command can be quickly executed.

To make the aforementioned and other features of the disclosure more comprehensible, several embodiments accompanied with drawings are described in detail as follows.

BRIEF DESCRIPTION OF THE DRAWINGS

FIG. 5 is a table showing relationships between standard commands and voltage supply nodes and restoration times of recovery according to another embodiment of the disclosure.

DETAILED DESCRIPTION OF DISCLOSED EMBODIMENTS

The semiconductor storing apparatus of the disclosure is not particularly limited, and is implemented as, for example, a Not AND (NAND) or a Not OR (NOR) flash memory.

Figure 3:
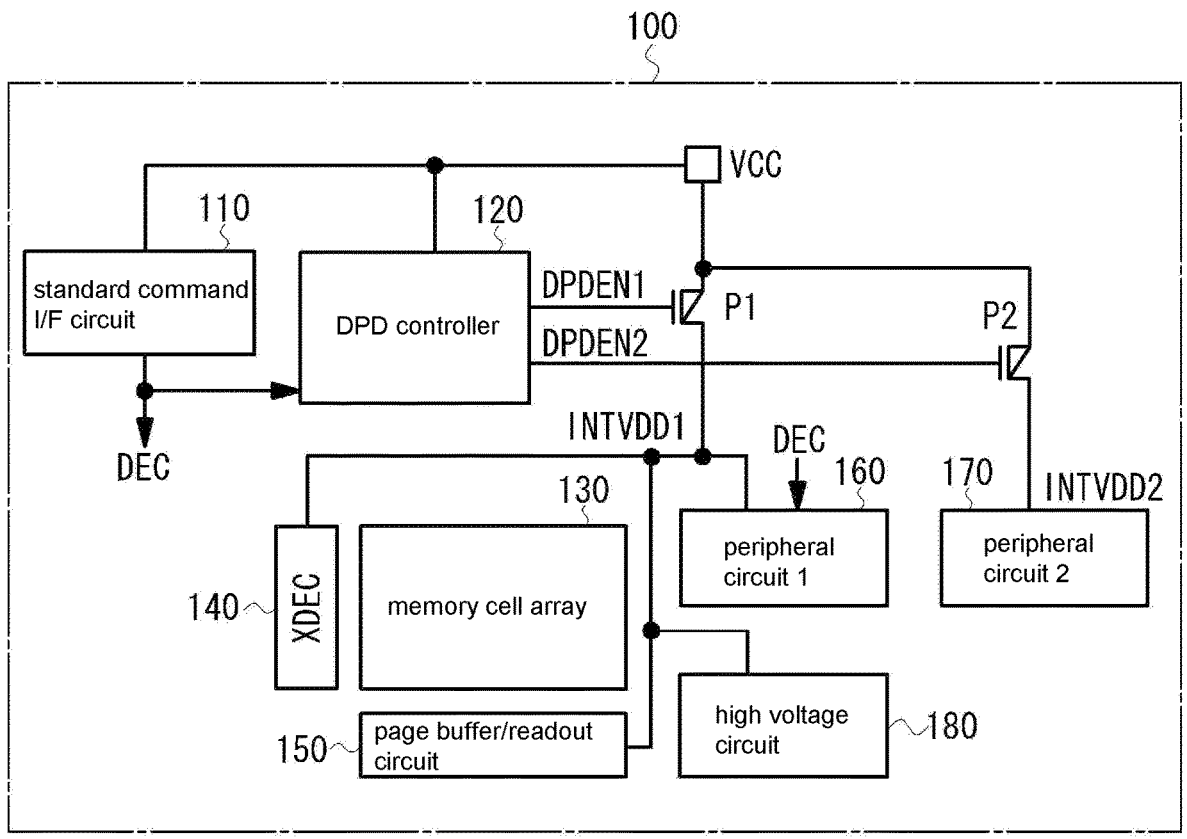
FIG. 3 is a diagram showing an internal structure of a flash memory according to an embodiment of the disclosure.

Next, the embodiments of the disclosure will be described in detail with reference to the drawings. FIG. 3 is a diagram showing a schematic internal structure of a NAND flash memory according to an embodiment of the disclosure. A flash memory 100 includes: a standard command interface (I/F) circuit 110 for accepting a standard command, a deep power-down mode (DPD) controller 120 for controlling the transition to a DPD mode, the release of the DPD mode, etc., a memory cell array 130, a row decoder 140, a page buffer/readout circuit 150, and internal circuits such as a peripheral circuit 160, a peripheral circuit 170, a high voltage circuit 180, etc.

The flash memory 100 of the embodiment can operate in a plurality of power consumption modes. An active mode does not limit power consumption and executes standard commands (such as reading, programming, erasing), etc. in full specifications. A stand-by mode operates the internal circuit according to the requirement of the specified power consumption while executing the operation in response to the inputted standard command, etc. when not in the active mode. In the stand-by mode, for example, the charge pump of the high voltage circuit is stopped or the internal supply voltage is reduced. In order to further reduce power consumption in the stand-by mode, the DPD mode blocks power supply to a specific circuit in the stand-by mode.

The standard command I/F circuit 110 and the DPD controller 120 directly operate using an external power voltage VCC (for example, 3.3V), that is, the standard command I/F circuit 110 and the DPD controller 120 may operate in the stand-by mode and the DPD mode. The standard command I/F circuit 110 is an interface circuit for externally accepting a standard command prepared in advance for a standard operation of a flash memory. The standard commands are, for example, commands for reading, programming, erasing, etc. The standard command I/F circuit 110 includes a complementary metal oxide semiconductor (CMOS) logic device for decoding the inputted standard command, and a decode result DEC is provided to the DPD controller 120 and the peripheral circuit 160 (including a controller, a state machine, etc. used to control the operation of the standard command).

The DPD controller 120 controls the transition from the stand-by mode to the DPD mode and the release of the DPD mode. A positive channel metal oxide semiconductor (PMOS) transistor P1 is connected between the external power voltage VCC and a voltage supply node INTVDD1, and a PMOS transistor P2 is connected between the external power voltage VCC and a voltage supply node INTVDD2. At the voltage supply node INTVDD1, the row decoder 140, the page buffer/readout circuit 150, the peripheral circuit 160, and the high voltage circuit 180 are connected, and at the voltage supply node INTVDD2, the peripheral circuit 170 is connected.

The DPD controller 120 generates the L-level DPD enable signal DPDEN1 and DPD enable signal DPDEN2 in the active mode and the stand-by mode to turn on the transistor P1 and the transistor P2, and supplies the external power voltage VCC to the voltage supply node INTVDD1 and the voltage supply node INTVDD2. In addition, the DPD controller 120 in the DPD mode transitions the DPD enable signal DPDEN1 and the DPD enable signal DPDEN2 to H-level, sets the transistor P1 and the transistor P2 as not turned on, and blocks voltage supply from the external power voltage VCC to the voltage supply node INTVDD1 and the voltage supply node INTVDD2. For example, the DPD enable signal DPDEN1 and the DPD enable signal DPDEN2 may be transitioned to H-level at different timings according to the elapsed time since the time point of transitioning to the stand-by mode.

The method for transitioning from the stand-by mode to the DPD mode is not particularly limited. In a certain form, the DPD controller 120 does not input a command for transitioning to the DPD mode from the user, but automatically transitions to the DPD mode in response to a signal from the peripheral circuit 160 (including a controller for controlling the operation of the flash memory). For example, if a signal indicating the transition to the stand-by mode is provided from the peripheral circuit 160 to the DPD controller 120, the DPD controller 120 measures time from the time point indicating the transition to the stand-by mode, transitions to the DPD mode when the duration of the stand-by mode exceeds a certain time to transition the DPD enable signal DPDEN1 and the DPD enable signal DPDEN2 to H-level, and blocks power supply from the external power voltage VCC. In addition, in another form, the DPD controller 120 may also transition to the DPD mode in response to the inputted command for transitioning to the DPD mode from the user.

Regarding the method for releasing the DPD mode, in a conventional flash memory, it is necessary to input a dedicated command for releasing the DPD mode from the outside. However, in the embodiment, the DPD mode is automatically released without inputting such a dedicated command. The details of the release function will be described later, but if the standard command I/F circuit 110 receives the standard command in the DPD mode, the DPD controller 120 releases the DPD mode in response to the standard command, and the standard command is seamlessly executed after the time required for the restoration of the DPD mode has elapsed.

The DPD controller 120 of the embodiment may be constructed using a hardware and/or a software, which may, for example, include a microcomputer, a state machine, a logic device, etc.

The memory cell array 130 contains a plurality of blocks, and each block contains a plurality of NAND strings. The NAND strings may be two-dimensionally formed on a substrate or three-dimensionally formed along a vertical direction from the main surface of the substrate. In addition, a memory unit may store binary data or multi-value data.

The peripheral circuit 160 and the peripheral circuit 170 include, for example, the following parts, etc.: a controller or a state machine, for controlling the operation of the flash memory 100 based on the standard command, etc. received by the standard command I/F circuit 110; or an error checking and correction (ECC) circuit and a column selection circuit, for detecting error and correcting data. The high voltage circuit 180 includes a charge pump circuit, etc., for generating the high voltage required for reading, programming, and erasing. In addition, the flash memory 100 may be installed with a serial peripheral interface (SPI). In the SPI, the control signal (allowing address latching, command latching, etc.) is replaced, and inputted command, address, and data are synchronously identified with a serial clock signal.

Figure 1A:
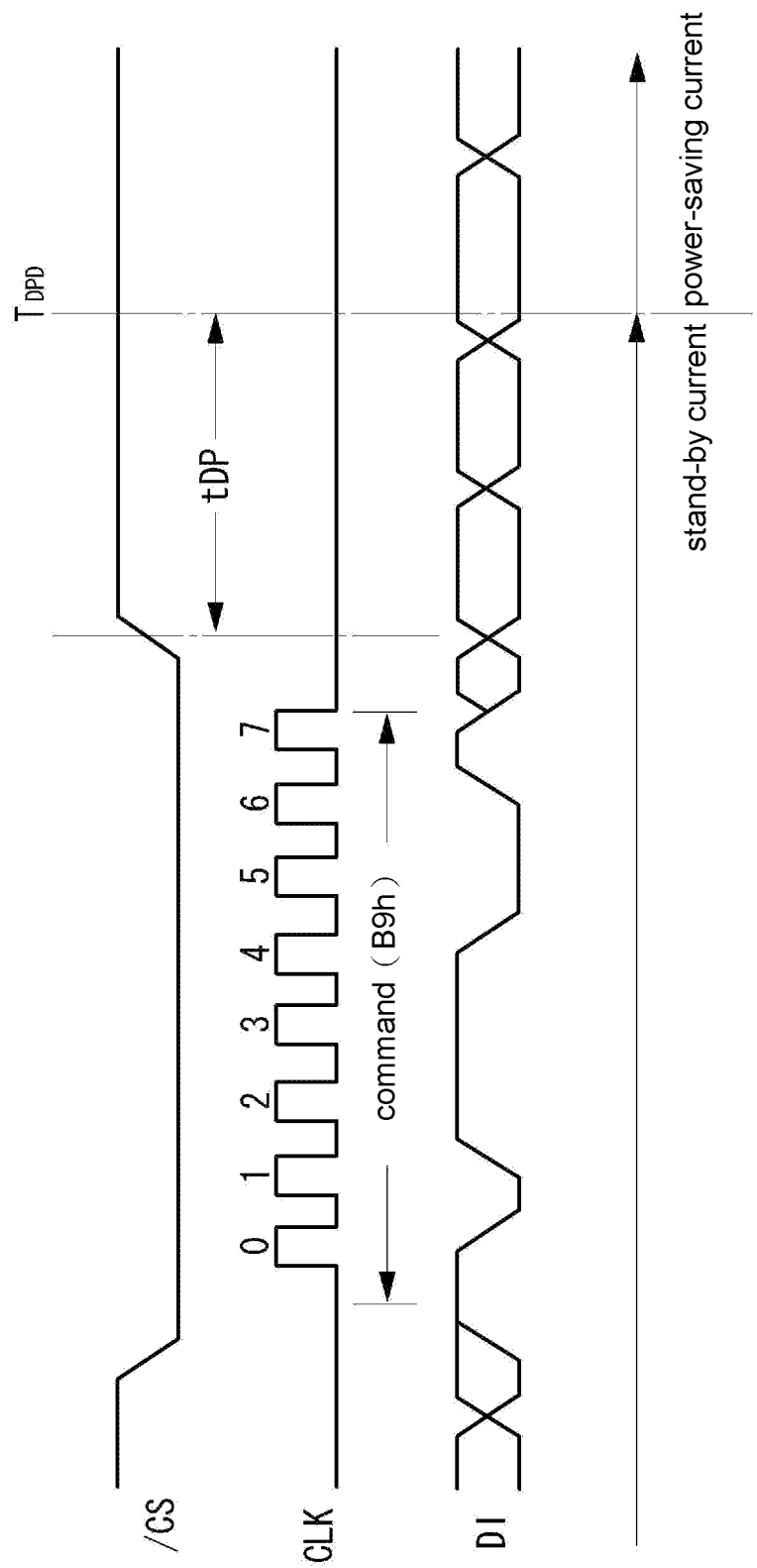
FIG. 1A is a diagram showing an example of an operation waveform when a conventional flash memory transitions to a deep power-down mode (DPD) mode.
Figure 1B:
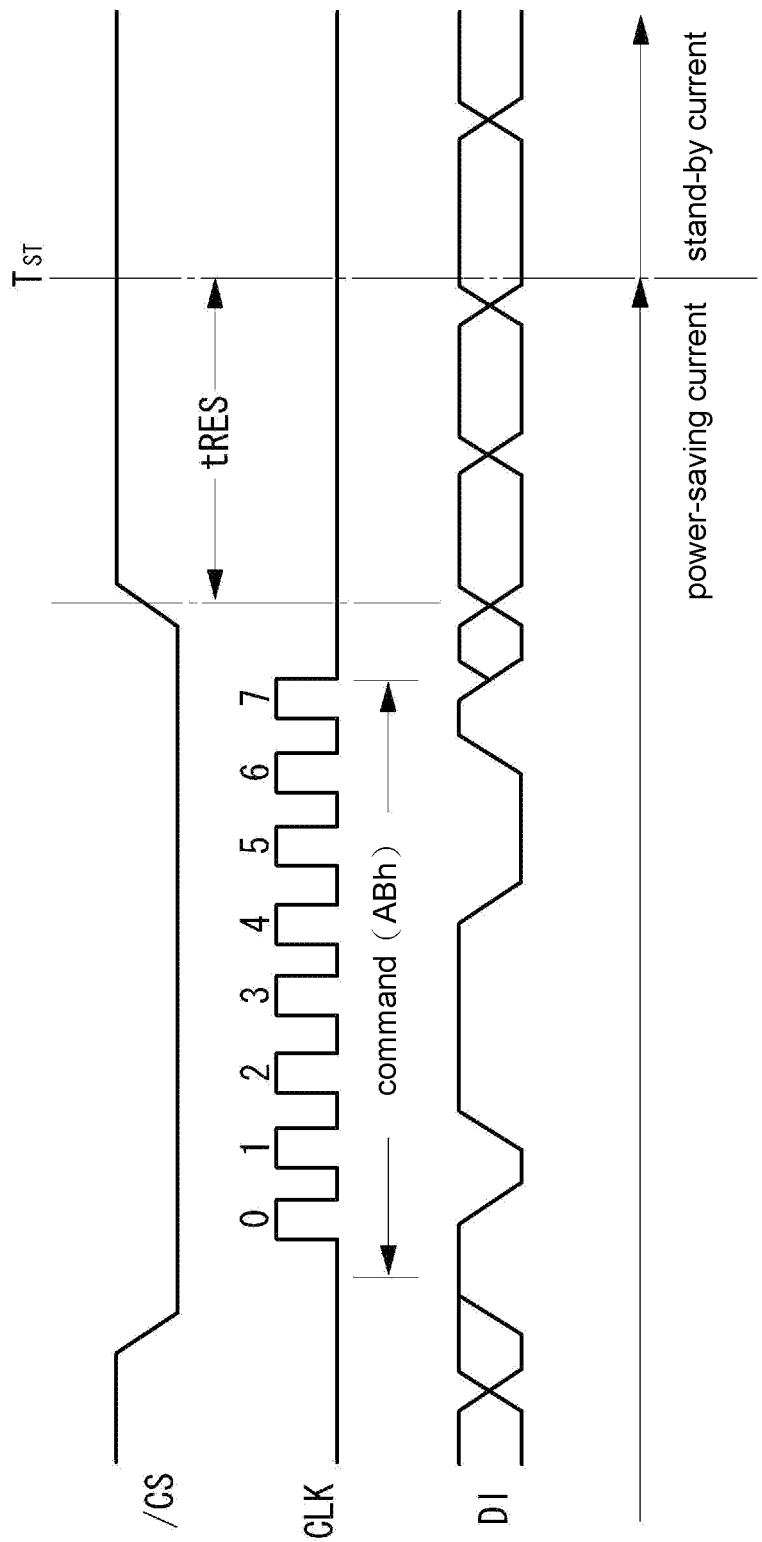
FIG. 1B is a diagram showing an example of an operation waveform when the conventional flash memory is released from the DPD mode.
Figure 2:
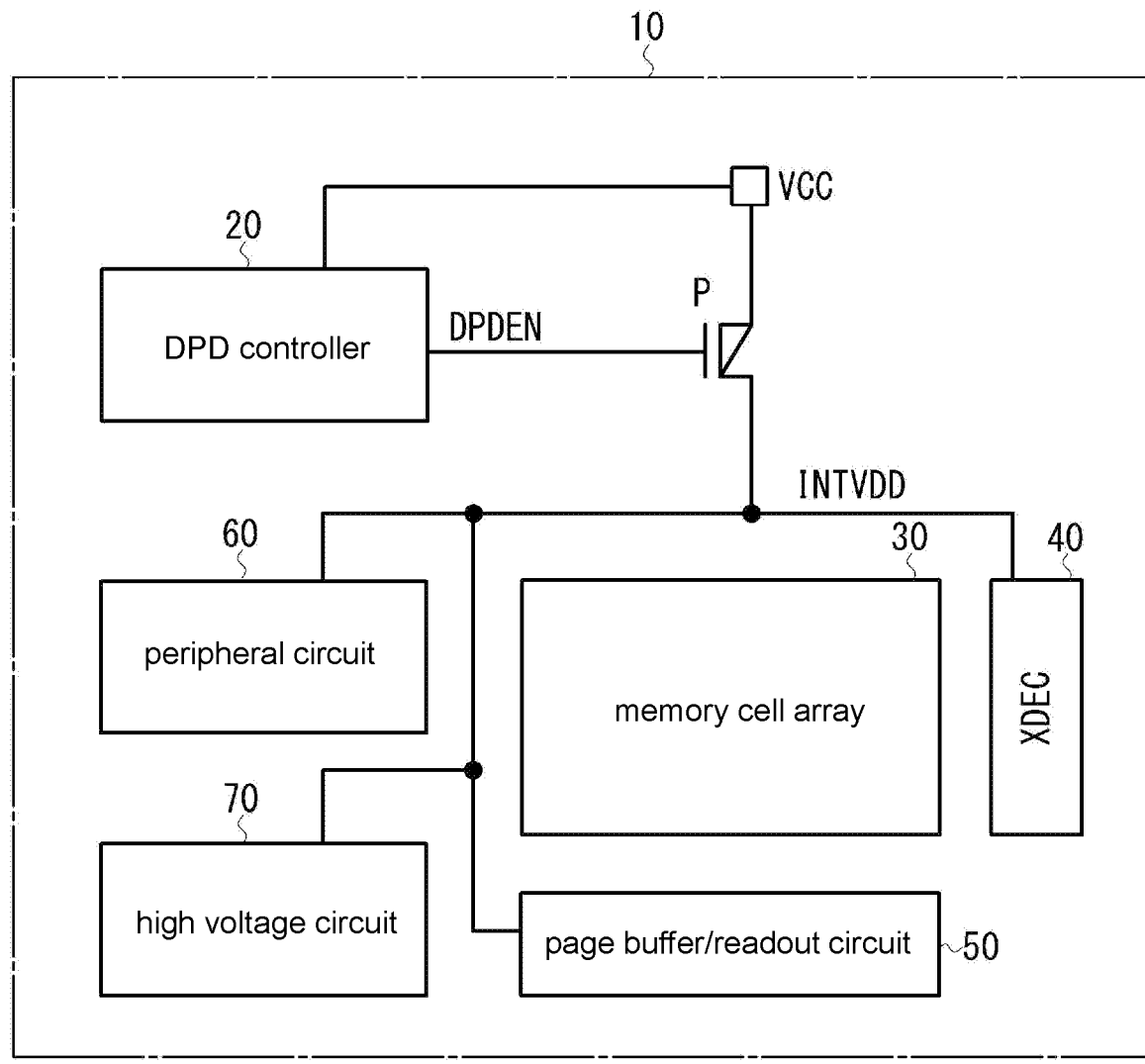
FIG. 2 is a diagram showing an internal structure of the conventional flash memory.
Figure 4:
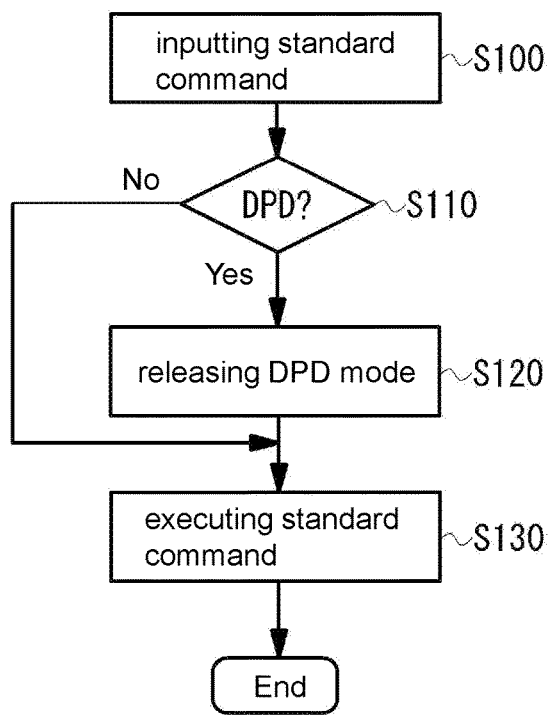
FIG. 4 is a flowchart showing a release sequence of a DPD mode according to an embodiment of the disclosure.

Next, the method for releasing the DPD mode of the flash memory according to the embodiment will be described with reference to the flowchart of FIG. 4. If a standard command (S100) is inputted to a standard command I/F circuit 110, a standard command I/F circuit 110 decodes the standard command and provides a decode result DEC to a DPD controller 120 and a peripheral circuit 160. The DPD controller 120 determines whether the flash memory is in a DPD mode (S110). In the case where the DPD mode is determined, the DPD controller 120 releases the DPD mode (S120). That is, the DPD controller 120 transitions a DPD enable signal DPDEN1 and a DPD enable signal DPDEN2 from H-level to L-level, sets a transistor P1 and a transistor P2 as turned on, and supplies power from an external power voltage VCC to a voltage supply node INTVDD1 and a voltage supply node INTVDD2. Accordingly, an internal voltage VDD1 is supplied from the voltage supply node INTVDD1 to a row decoder 140, a page buffer/readout circuit 150, and the peripheral circuit 160, and an internal voltage VDD2 is supplied from the voltage supply node INTVDD2 to a peripheral circuit 170. Peripheral circuits 140 to 180 are restored to an operable state at a time $T_{ST}$ after a period tRES as shown in FIG. 1B.

When the restoration of the peripheral circuit 140 to the peripheral circuit 180 is completed, the peripheral circuit 160 executes the operation of the standard command based on the decode result DEC from the standard command I/F circuit 110 (S130). The period (tRES) during which the peripheral circuit is restored through releasing the DPD mode is a busy period during which access to the flash memory is prohibited. In the embodiment, the standard command is seamlessly executed after the period tRES.

On the other hand, in the case where the DPD controller 120 determines that the inputted standard command is not the DPD mode (S110), the DPD is not released (that is, the DPD enable signal DPDEN1 and the DPD enable signal DPDEN2 are already at L-level), and the operation of the standard circuit is immediately executed through the peripheral circuit 160 (S130).

As a specific operation example, if a read, program, or erase command is inputted to the standard command I/F circuit 110 in the DPD mode, the DPD controller 120 transitions the DPD enable signal DPDEN1 and the DPD enable signal DPDEN2 to L-level to turn on the transistor P1 and the transistor P2 in order to release the DPD mode. Next, the internal circuit is restored during the period tRES shown in FIG. 1B, and reading, programming, or erasing is immediately executed.

In this way, according to the embodiment, the DPD mode is automatically released in response to the inputted standard command. Therefore, it is not necessary to input a dedicated command for releasing the DPD mode and even a flash memory that does not support the command for releasing the DPD mode can release the DPD mode. Furthermore, for a flash memory that automatically controls the transition from the stand-by mode to the DPD mode (that is, a dedicated command for transitioning to the DPD mode is not required), the user input of all commands related to the DPD mode may be skipped to automatically transition and release the DPD mode.

Next, another embodiment of the disclosure will be described. In the above embodiment, the DPD controller 120 restores all internal circuits from the DPD mode in response to the inputted standard command. However, in the present embodiment, the restored internal circuit is selected according to the type of the standard command. The table in FIG. 5 shows relationships between standard commands of the present embodiment and voltage supply nodes and restoration (recovery) times of restoration. The standard commands include a status read or an identifier (ID) read in addition to reading, programming, and erasing. The status read is to read whether the flash memory is in a ready state, whether the flash memory is in a write protection mode, whether it is a command in a programming/erasing operation, and the ID read is to read a command for identifying a manufacturer or a product.

In the case where the standard command is equivalent to the status read or the ID read, the DPD controller 120 only transitions a DPD enable signal DPDEN1 to L-level to turn on a transistor P1, and only recovers a voltage supply node INTVDD1. At this time, only the voltage supply node INTVDD1 is recovered, so the recovery time can be accelerated. On the other hand, in the case where the standard command is equivalent to programming, reading, and erasing, the DPD controller 120 transitions both the DPD enable signal DPDEN1 and a DPD enable signal DPDEN2 to L-level to turn on the transistor P1 and a transistor P2, and recovers the voltage supply node INTVDD1 and a voltage supply node INTVDD2. Here, the recovery time is the standard time.

In this way, according to the embodiment, the DPD mode may be released with an appropriate recovery time according to the operation content of the standard command, and the standard command may be executed.

In the embodiments, an example in which the external power voltage VCC is supplied to the voltage supply node INTVDD1 and the voltage supply node INTVDD2 is shown, but other internal voltages may also be supplied to the voltage supply node INTVDD1 and the voltage supply node INTVDD2 without directly supplying from the external power voltage VCC.

The embodiments of the disclosure are described in details above, but the disclosure is not limited to the specific embodiments, and various modifications and changes may be made within the scope of the disclosure as recited in the claims.

What is claimed is:

1. A flash memory operation method, comprising:
    a step of detecting whether a flash memory is in a deep power-down mode blocking power supply to a specific circuit in response to input of a standard command comprising reading, programming, or erasing;
    a step of releasing the specific circuit from the deep power-down mode according to a type of the standard command in response to detection of the deep power-down mode under input of the standard command; and
    a step of executing the standard command after the specific circuit is restored.

2. The flash memory operation method according to claim 1, wherein
    in a case where the deep power-down mode is not detected, the inputted standard command is executed.

3. The flash memory operation method according to claim 1, wherein
    the step of releasing comprises: turning on a switching transistor connected between a power voltage and the specific circuit.

4. The flash memory operation method according to claim 1, wherein,
    the deep power-down mode transitions from a stand-by mode and further reduces power consumption in the stand-by mode.

5. A semiconductor storing apparatus, comprising:
    a peripheral circuit; and
    a deep power-down mode controller, configured to:
        detect whether a flash memory is in a deep power-down mode blocking power supply to one or more specific circuits of the peripheral circuit in response to input of a standard command comprising reading, programming, or erasing from an outside;
        release a specific circuit from the deep power-down mode according to a type of the standard command in response to detection of the deep power-down mode under input of the standard command; and
        execute the standard command after the specific circuit is restored.

6. The semiconductor storing apparatus according to claim 5, wherein
    in a case where the deep power-down mode is not detected, the standard command is executed.

7. The semiconductor storing apparatus according to claim 6, wherein
    the semiconductor storing apparatus is a flash memory.

8. The semiconductor storing apparatus according to claim 5, wherein,
    the deep power-down mode controller comprises a plurality of switching transistors respectively connected between an external power voltage and a plurality of specific circuits, and the deep power-down mode controller turns on any one of the plurality of switching transistors.

9. The semiconductor storing apparatus according to claim 8, wherein
    the semiconductor storing apparatus is a flash memory.

10. The semiconductor storing apparatus according to claim 5, wherein
    the semiconductor storing apparatus is a flash memory.

* * * * *